United States Patent [19]
Lee et al.

[11] Patent Number: 5,812,466
[45] Date of Patent: Sep. 22, 1998

[54] COLUMN REDUNDANCY CIRCUIT FOR A SEMICONDUCTOR MEMORY DEVICE

[75] Inventors: Jung-Hwa Lee, Kyungki-do; Jin-Man Han, Seoul; Dong-Il Seo, Kyungki-do, all of Rep. of Korea

[73] Assignee: Samsung Electronics Co., Ltd., Suwon, Rep. of Korea

[21] Appl. No.: 724,798

[22] Filed: Oct. 2, 1996

[30] Foreign Application Priority Data

Oct. 4, 1995 [KR] Rep. of Korea ................. 95-33821

[51] Int. Cl.$^6$ ........................................... G11C 7/00
[52] U.S. Cl. .................... 365/200; 365/201; 365/225.7; 365/230.02
[58] Field of Search ..................... 365/200, 225.7, 365/201, 220, 230.02, 189.02

[56] References Cited

U.S. PATENT DOCUMENTS

| | | | |
|---|---|---|---|
| 5,416,740 | 5/1995 | Fujita et al. | 365/200 |
| 5,517,450 | 5/1996 | Ohsawa | 365/200 |
| 5,548,553 | 8/1996 | Cooper et al. | 365/200 |
| 5,576,999 | 11/1996 | Kim et al. | 365/200 |
| 5,612,917 | 3/1997 | Kozaru et al. | 365/200 |

*Primary Examiner*—Joseph A. Popek
*Assistant Examiner*—Hien Nguyen
*Attorney, Agent, or Firm*—William L. Geary, Jr.

[57] ABSTRACT

The present invention relates to a semiconductor memory device incorporating a column redundancy circuit using a decoded fuse. The column redundancy circuit is capable of designating a repaired address during a parallel test mode of memory operation when an address input is a "don't care," and it is particularly useful in a multiple input/output memory architecture which uses one column select per I/O line. The column redundancy circuit includes: transmitting means comprised of the data input/output lines for transmitting the data of the memory cell; column decoder and input/output control circuits connected to the transmitting means and decoding a column address input to input data; a circuit connected to the transmitting means and outputting a given signal to the column decoder and input/output control circuits in response to a plurality of output signals output from fuses and a signal for controlling the transmitting means; a plurality of decoded fuse circuits, the levels of which are determined by one fuse connected to the circuit; multiplexers for selectively transmitting data from one of the data input/output lines to a specific data bus line among a plurality of data bus lines; and a decoding circuit which receives the outputs of the decoded fuse circuits and generates a redundancy signal.

10 Claims, 5 Drawing Sheets

COLUMN REDUNDANCY CIRCUIT FOR A SEMICONDUCTOR MEMORY DEVICE

BACKGROUND OF THE INVENTION

1. Field of the Invention

The present invention relates to a semiconductor memory device, and more particularly, to a column redundancy circuit using a decoded fuse. The column redundancy circuit is capable of designating a repaired address during a parallel test mode of memory operation when an address input is a "don't care," and it is particularly useful in a multiple input/output ("I/O") memory architecture which has one column select per I/O line.

2. Description of the Related Art

In semiconductor memory devices, particularly in dynamic random access memory, a redundancy repair circuit has become increasingly important. As the semiconductor chip pattern features are decreased by sub-micron manufacturing techniques and chip area is enlarged, there is an increased probability of producing a defective product, thereby reducing production yield. Moreover, limitations in the manufacturing process and in the removal of particle contaminants have resulted in increased technical difficulties. Accordingly, the redundancy repair circuit has become very important for increasing production yield in spite of the apparent limitations in semiconductor manufacturing technology.

FIG. 3 shows a conventional column redundancy repair circuit. Fuse circuits 100 are comprised of signal transmission gates 4 for transmitting address signals CAi and CAiB (where i=0 to n) and fuses 2 which may be cut to selectively transmit the address signals. This prior art redundancy circuit may function properly during normal memory operations. However, the circuit does not function properly during the parallel test mode of operation in which multiple memory blocks within a chip are tested in parallel and the decoding of higher-order address bits is a "don't care." Further, it is difficult to sense a repaired address and impossible to perform the parallel test mode in which an address at the input to a redundancy repair fuse 2 is a "don't care."

FIG. 1 shows a prior art memory cell array comprised of: bit lines B/L and B/L\ to which a plurality of memory cells are connected; sense amplifiers S/A; word lines W/L; data input/output lines I/O and I/O\ arranged in a direction perpendicular to the bit lines B/L and B/L\; column select lines CSL; row decoders 200 connected to the word lines W/L in the memory cell array; and data level amplifiers I/O S/A 220 for amplifying the data level of data input/output lines I/O and I/O\. The aforementioned structure and function is well-known in the memory art. In the memory architecture of FIG. 1, it is very difficult to sense a repaired address and it is impossible to execute the parallel test mode when an address bit designated as a "don't care" is input to a redundancy fuse (FIG. 3). Furthermore, the newer dynamic random access memory ("DRAM") architecture such as the multi-I/O scheme is considered as the necessary architecture for high-density memory. Even when using the prior art redundancy circuit with other memory architectures similar to the multi-I/O scheme, it is difficult to designate the correct memory cell in the parallel test mode when a given address is a "don't care."

SUMMARY OF THE INVENTION

Accordingly, it is an object of the present invention to provide a decoded column redundancy circuit capable of inputting an address to be a "don't care" in a parallel test mode, even when using a multi-input/output memory architecture.

It is another object of the present invention to provide a decoded column redundancy circuit capable of designating a repaired address by cutting a fuse, without regard to whether or not an address input is a "don't care" in a parallel test mode in a memory architecture which uses a multi-input/output scheme.

It is further another object of the present invention to provide a decoded column redundancy circuit including a decoded fuse capable of overcoming the foregoing conventional problems by designating a repaired address, without regard to whether or not the address is a "don't care" in a parallel test mode.

To achieve these and other objects, the present invention provides a semiconductor memory device having a memory cell array comprised of bit lines to which a plurality of memory cells are connected; sense amplifiers and data input/output lines which are connected by a column select line; and a plurality of column decoders with a column redundancy circuit. The column redundancy circuit includes: transmitting means comprised of the data input/output lines for transmitting the data of the memory cell; column decoder and input/output control circuits connected to the transmitting means and decoding a column address input to input data; a circuit connected to the transmitting means and outputting a given signal to the column decoder and input/output control circuits in response to a plurality of output signals output from fuses and a signal for controlling the transmitting means; a plurality of decoded fuse circuits, the levels of which are determined by one fuse connected to the circuit; multiplexers for selectively transmitting data from one of the data input/output lines to a specific data bus line among a plurality of data bus lines; and a decoding circuit which receives the outputs of the decoded fuse circuits and generates a redundancy signal.

BRIEF DESCRIPTION OF THE DRAWINGS

A more complete appreciation of this invention and many of the attendant advantages thereof will be readily apparent as the same becomes better understood by reference to the following detailed description and drawings wherein.

DETAILED DESCRIPTION OF THE PREFERRED EMBODIMENTS

One or more preferred embodiments of the present invention is described in detail below with reference to the attached figures.

Figure 1:
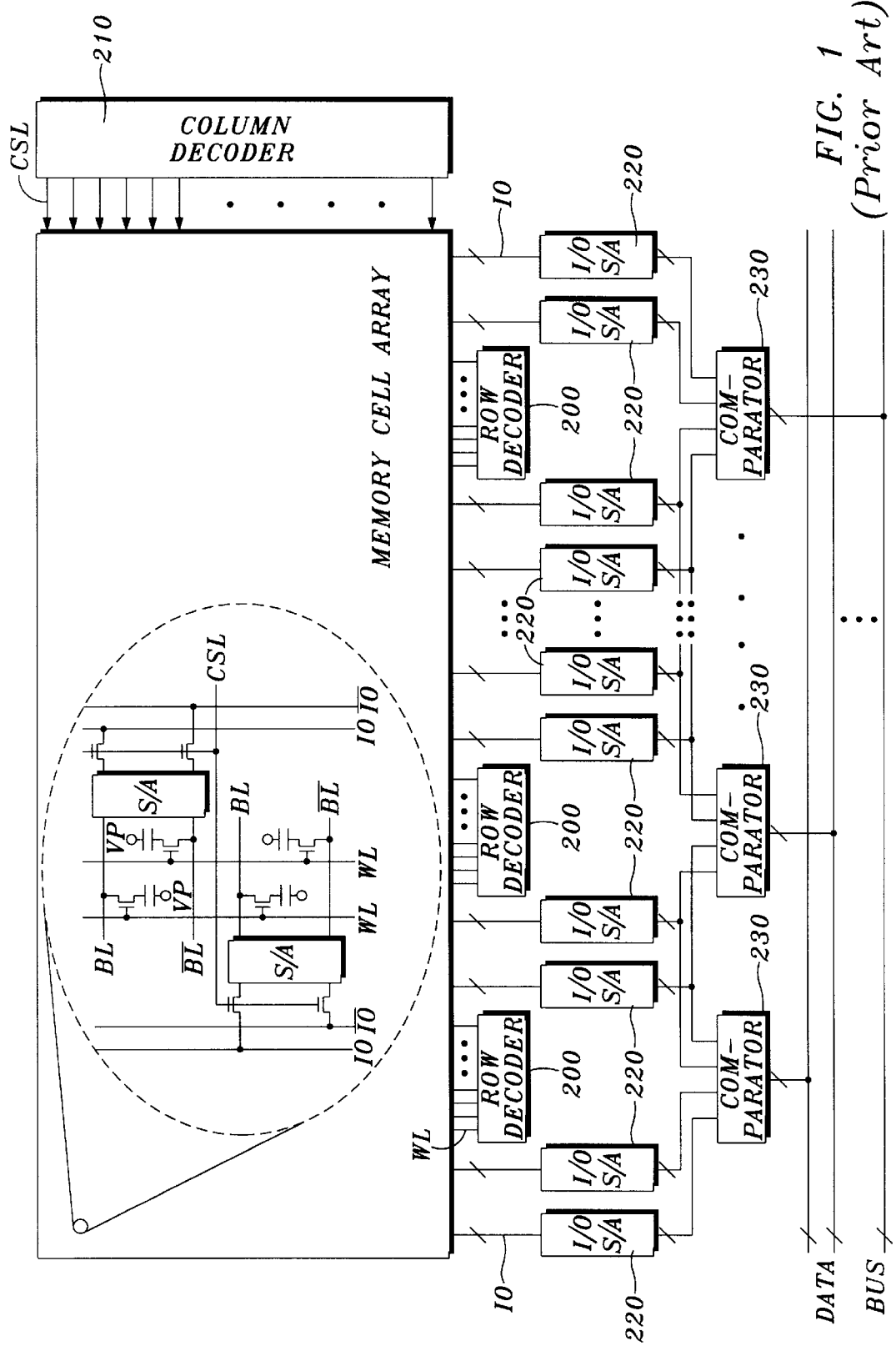
FIG. 1 is a circuit diagram showing a prior art configuration of a conventional memory cell array.
Figure 2:
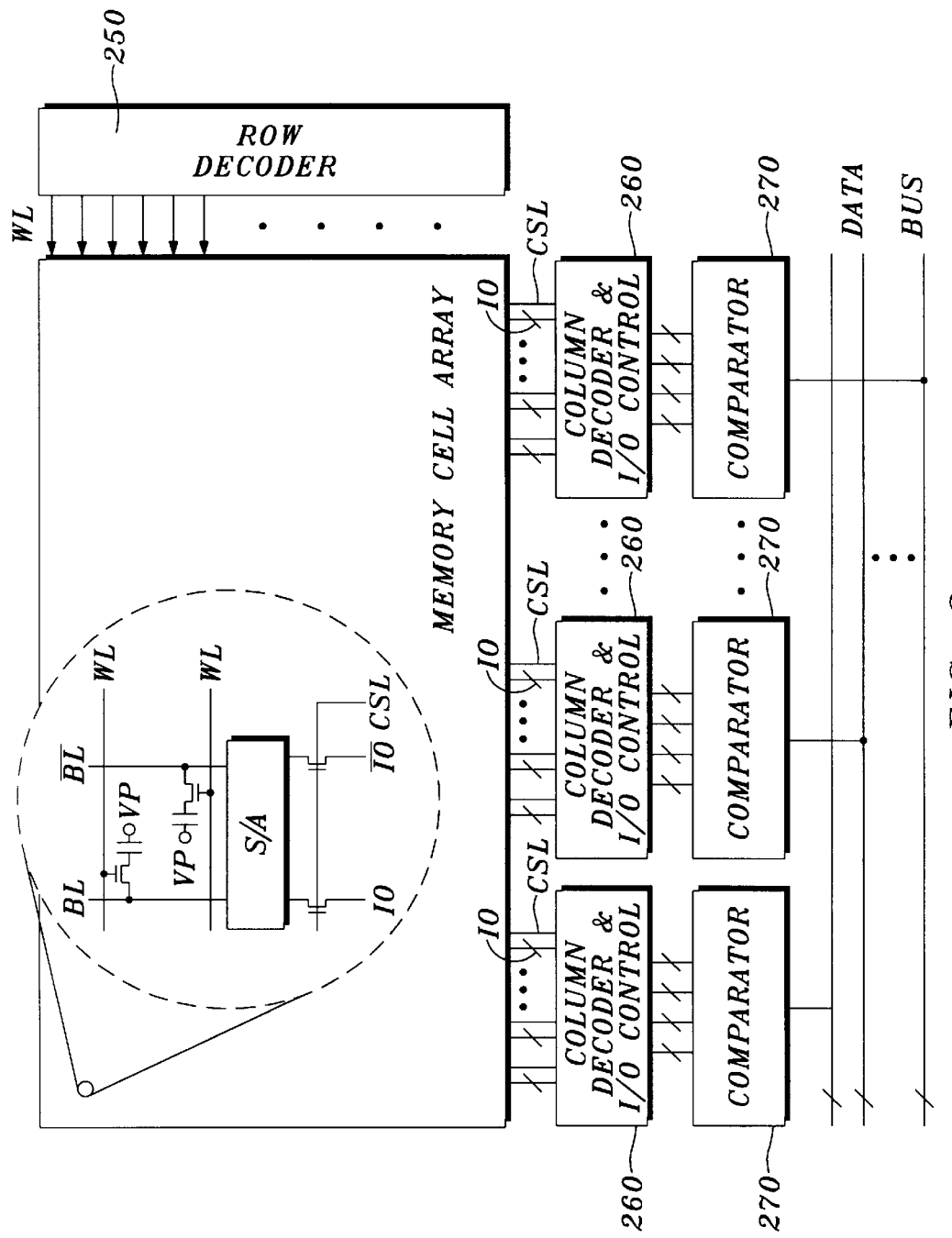
FIG. 2 is a circuit diagram showing a prior art configuration of a memory cell array in a multiple input/output memory architecture.

FIG. 2 shows a configuration of a memory cell array of a multi-input/output memory architecture in accordance with the present invention. In a multi-I/O memory architecture, the memory arrays are divided such that there is one column-select line per I/O line, thereby allowing the use of shorter I/O lines, with the resulting advantages of less line loading, better noise margin, and higher speed operation. In a multi-I/O memory architecture, there are bit lines B/L and B/L\ to which a plurality of memory cells are connected; word lines WL arranged perpendicular to the bit lines; data input/output lines IO and IO\; sense amplifier S/A connected between the bit lines and IO lines; a row decoder 250 connected to the memory cell array by word lines WL; and column decoder and data input/output control circuits 260 which output column select lines CSL to each block of memory cells.

Figure 3:
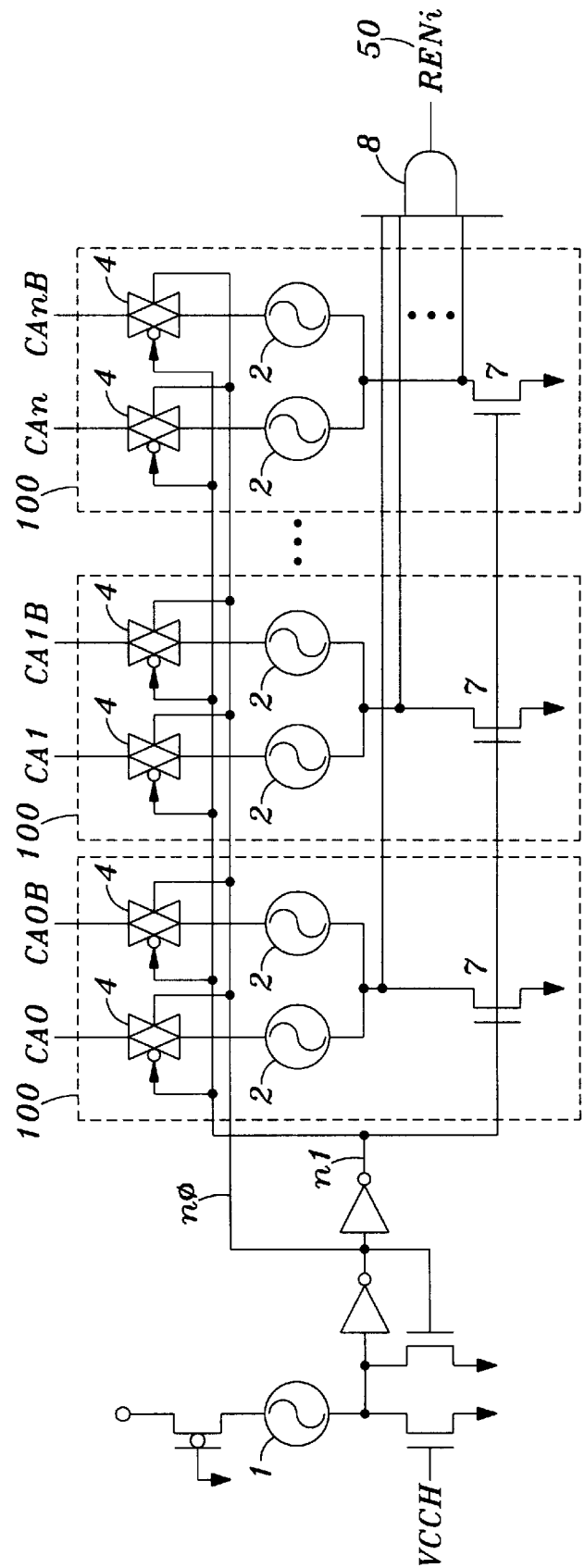
FIG. 3 is a circuit diagram illustrating a prior art conventional column redundancy repair circuit.

In FIG. 3, the prior art column redundancy circuit used in a conventional memory array, redundancy signal RENi 50 cannot be properly generated unless each input to the AND gate 8 is specified, which requires that each address CA0 to CAn be specified. The redundancy circuit cannot operate properly when some of the address bits are in a "don't care" condition, such as when the multi-I/O memory architecture circuit of FIG. 2 is operated in the parallel test mode.

Figure 4:
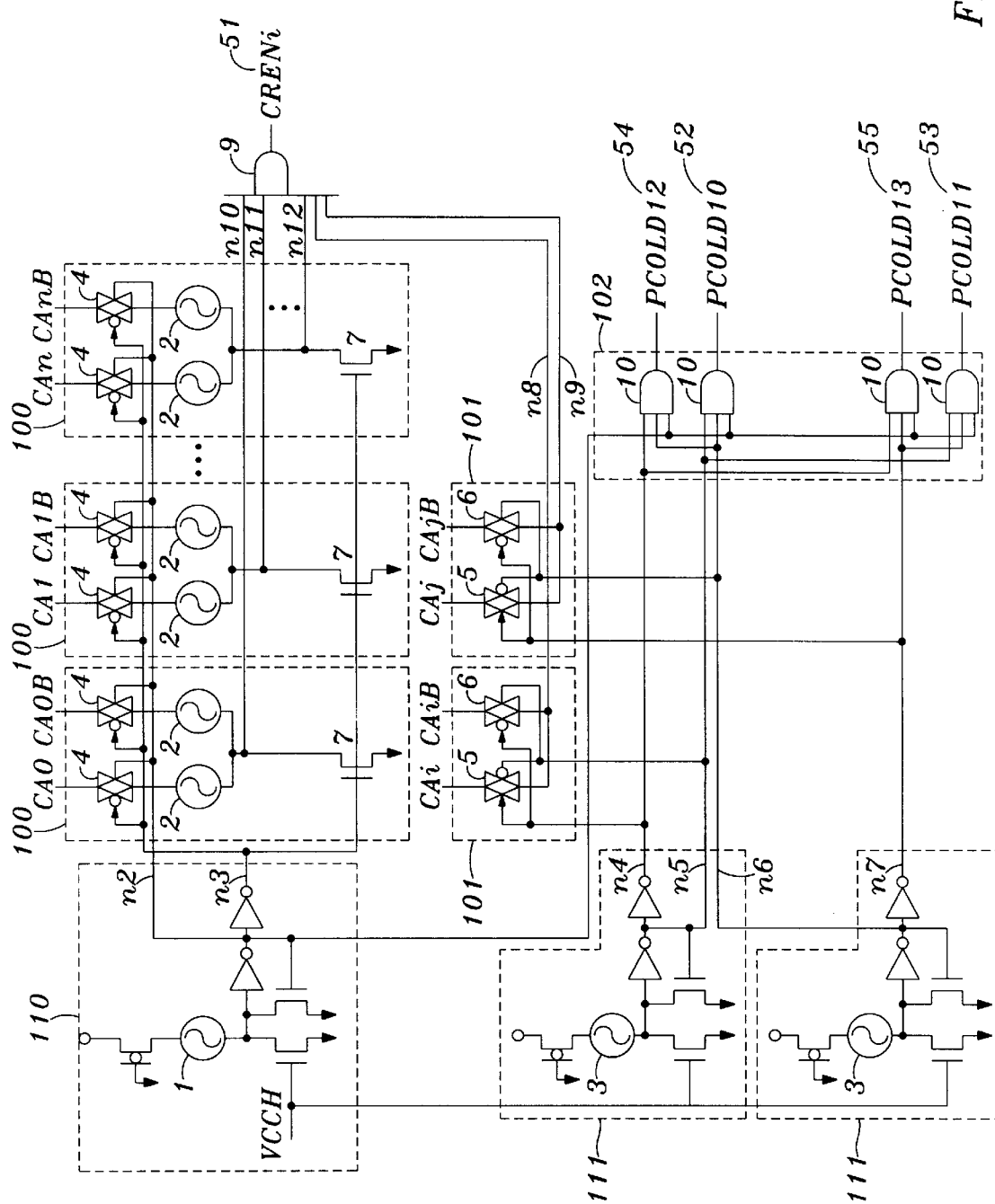
FIG. 4 is a circuit diagram illustrating a decoded column redundancy repair circuit in accordance with the present invention.

FIG. 4 shows a circuit diagram of a decoded fuse column redundancy repair circuit in accordance with the present invention. Referring to FIG. 4, a plurality of first redundancy unit circuits 100 are respectively comprised of transmitting means 4 transmitting column addresses CAn and CAnB (n=0, 1, 2 . . . n), fuses 2 connected to transmitting means 4, and switches 7. A main switching circuit 110 has a node n3 which enables the plurality of first redundancy unit circuits 100 and a decoder circuit 102 by cutting a fuse 1. A pair of fuse circuits 111 are comprised of nodes n4 and n7 having a level of a logic "high" or a logic "low" set by fuses 3 and of nodes n5 and n6 having the opposite logic level of nodes n4 and n7, respectively. A plurality of second redundancy unit circuits 101 are constructed of first and second column address transmitting means 5 and 6 which are controlled by output nodes n4, n5, n6, and n7 of the fuse circuits 111, and which generate an enable signal of a first redundancy output node 51 via logic gate 9. A decoder circuit 102 is enabled by an output node n2 of the main switching circuit 110 to selectively enable one of a plurality of second redundancy output nodes 52, 53, 54 and 55 according to the state of output nodes n4, n5, n6 and n7 of the fuse circuits 111. The operation of FIG. 4 is described in more detail below, together with a description of FIG. 5.

Figure 5:
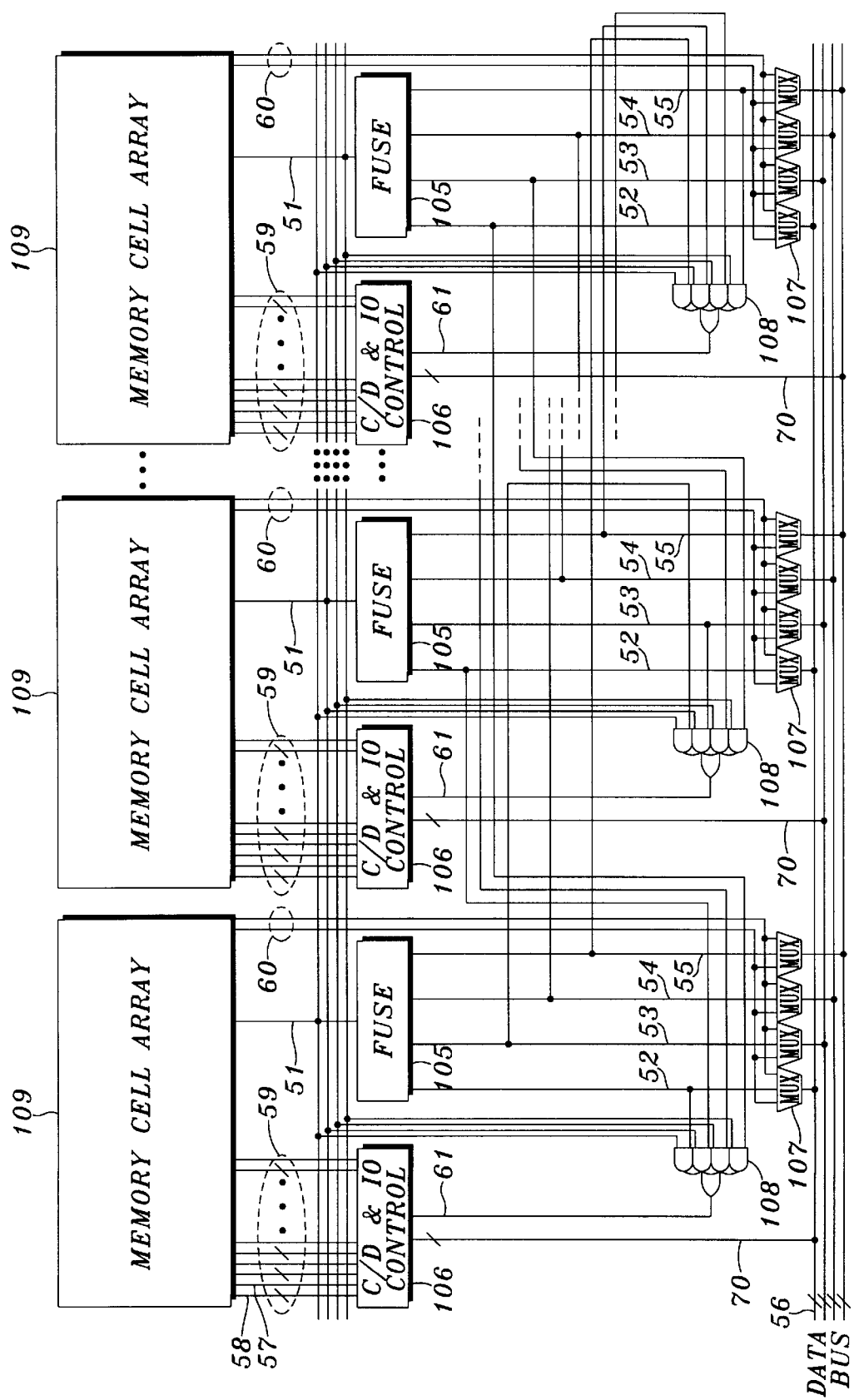
FIG. 5 is a circuit diagram showing an entire memory configuration including a decoded column redundancy repair circuit in accordance with the present invention.

FIG. 5 shows a configuration of a memory array to which the decoded redundancy repair circuit in accordance with the present invention is applied. Memory cell array 109 comprises a normal memory cell array and a redundant memory cell array, which are not separately shown in the drawing. Signal lines 59 comprise I/O lines 57 and column select lines 58, which are connected between the normal memory cell array and the column decoder and input/output line control circuit 106. Data I/O lines 60 and column redundancy enable signal 51 are connected to the redundant memory cell array within the memory cell array 109. Fuse 105 is a decoded redundancy repair circuit that corresponds to the circuitry in FIG. 4 which generates signals 51, 52, 53, 54, and 55. In FIG. 5, the semiconductor memory device is constructed of a plurality of memory cell arrays 109; column decoder and input/output line control circuits 106; decoded redundancy repair circuits (or "fuses") 105 which generate signals 51, 52, 53, 54, and 55; and logic circuits 108 which each combine redundancy enable signals 51 and one of signals 52, 53, 54, or 55 to decode an entire redundancy address. The column decoder and input/output line control circuit 106 generates column select signals 58 and is connected to the memory array 109 via I/O lines 57, and is connected to the data bus 56 via I/O lines 70. Multiplexers 107 selectively transmit data input/output lines 60 from the redundant memory cells to data bus lines 56 according to the signals 52, 53, 54, and 55 generated by the redundancy repair circuits 105.

In FIG. 4, upon initial power-up of the semiconductor device, signal VCCH is maintained in the "high" state. If fuse 1 is not cut, the outputs of nodes n2 and n3 are respectively maintained in a logic "low" state and a logic "high" state, thereby providing a low signal at the input to decoder 102 and rendering the redundancy repair circuit inoperative. If fuse 1 is cut, node n2 is placed in "high" state, thereby providing a high signal to the input of decoder circuit 102 and enabling the redundancy repair circuit to operate.

In FIG. 4, if the main switching fuse 1 is cut, the states of output nodes n4, n5, n6, and n7 are determined by whether the fuses 3 of the respective fuse circuits 111 are cut or intact. Output nodes n4, n5, n6, and n7 select the transmission through transmission means 5 and 6 of one of column address signals CAi or CAiB representing either a logic high or a logic low level. Output nodes n2 and n3 enable the transmission through transmission means 4 of column address signals CAn and CAnB. The logic gate 9 produces the column redundancy enable signal CRENi 51 in response to the column address input signals on nodes n8, n9, n10, n11 and n12.

In FIG. 5, signals 51, 52, 53, 54, and 55 of the fuse circuit 105 shown in detail in FIG. 4 are properly decoded by logic circuit 108 to produce signal 61. Signal 61 is input to the column decoder and input/output lines control circuit ("C/D & IO CONTROL") 106 to disable the operation of the column select line 58 that would typically have been operated if the redundancy circuit had not been enabled by the fuse circuit. When redundant memory cells are not selected, the normal memory cell data is selected by the normal column select line 58, is input to circuit 106 through the data input/output lines 57, and is sent via data lines 70 to the data bus line 56 assigned to the corresponding memory segment. When redundant memory cells are selected, the redundancy memory cell data is selected by the column redundancy select line 51, and the data is sent to the data bus lines 56 via redundancy data input/output lines 60 and multiplexers 107. Multiplexers 107 are controlled by signal lines 52, 53, 54, and 55 to connect the redundancy cell data to specific data bus lines among the plurality of data bus lines 56.

Accordingly, some of the advantages of the present invention are that a repaired address may be designated by cutting a fuse, and the redundancy circuit operates correctly during a parallel test mode of memory operation with memory architectures such as multi-I/O memory. The multi-I/O memory architecture is considered as a necessary architecture for many kinds of memory devices. Even in other memory architectures similar to this architecture, the designation of a memory cell becomes difficult in the parallel test mode when a given address is a "don't care." In addition, the present invention is very useful in implementing memory cell redundancy in synchronous DRAM, cached DRAM using a high-speed accessing method, and in other memory architectures.

This present invention is not limited to the particular embodiments disclosed herein, but includes other embodiments apparent to one of ordinary skill in the art as defined by the appended claims.

What is claimed is:

1. A column redundancy circuit for a semiconductor memory device having a plurality of memory cell arrays each comprising a plurality of bitlines, a plurality of memory cells connected to each bitline, a plurality of sense amplifiers coupled between a plurality of data input/output lines and the bitlines, and a plurality of switches controlled by column select signals and coupled between the sense amplifiers and the data input/output lines; the column redundancy circuit comprising:

a redundant memory cell array containing at least one redundant memory cell column coupled to redundancy data input/output lines, each redundant memory cell column selected by a redundant column select signal;

a decoded redundancy repair circuit comprising an enable input; a plurality of inputs for receiving a particular column address; an output coupled to a logic circuit and to one of the redundant memory cell columns, for generating the redundant column select signal; a plurality of outputs for generating redundancy enable signals, which are each coupled to one of a plurality of multiplexers; and a main switching fuse circuit coupled to the enable input and having an output responsive to a main fuse, wherein the output of the main switching fuse circuit generates a main switching fuse signal to enable the decoded redundancy repair circuit when the main fuse is in a programmed condition;

a column decoder and input/output control circuit connected between the data input/output lines and a data bus, and receiving a column address and a column disable signal, wherein the column decoder and input/output control circuit generates a column select signal responsive to the column address and selectively connects the data input/output lines to a data bus if the column disable signal is false, and does not generate the column select signal and does not selectively connect the data input/output lines to the data bus if the column disable signal is true;

the logic circuit coupled between the decoded redundancy repair circuit and the column decoder and input/output control circuit, wherein the logic circuit generates the column disable signal in response to the redundant column select signal and the redundancy enable signals; and the plurality of multiplexers coupled between the redundancy data input/output lines and the data bus, wherein the multiplexers connect the redundancy data input/output lines to the data bus in response to the redundancy enable signals.

2. A column redundancy circuit as in claim 1, wherein the decoded redundancy repair circuit further comprises:

a plurality of first redundancy unit circuits which each have an output coupled to an input of a first decoder which generates the redundant column select signal;

a plurality of second redundancy unit circuits which each have an output coupled to another input of the first decoder; and a plurality of fuse circuits having outputs connected to the second redundancy unit circuits and to a second decoder circuit, wherein the fuse circuit outputs control the second redundancy unit circuits, and wherein the second decoder circuit generates the redundancy enable signals in response to the fuse circuit outputs.

3. A column redundancy circuit as in claim 2, wherein each of the first redundancy unit circuits further comprises:

a first and a second transmitting circuit each having enable inputs which receive the main switching fuse signal, wherein the first transmitting circuit receives one bit of the column address, and the second transmitting circuit receives the complement of the bit; and a first fuse coupled between an output of the first transmitting circuit and an output node, and a second fuse coupled between an output of the second transmitting circuit and the output node, wherein only one of the first and second fuses is conductive; and a transistor having a source and a drain coupled between the output node and a reference voltage, and a gate coupled to the main switching fuse signal, wherein the transistor is turned off and the output node produces either the bit or the complement of the column address in response to the main switching fuse signal.

4. A column redundancy circuit as in claim 3, wherein each of the second redundancy unit circuits further comprises:

a first and a second column address transmitting circuit, the first column address transmitting circuit inputting one of a plurality of most significant bits of the column address, and the second column address transmitting circuit inputting the complement of the most significant bit; and wherein the fuse circuit outputs selectively enable either the first or the second column address transmitting circuits.

5. A column redundancy circuit as in claim 4, further comprising two of the second redundancy unit circuits corresponding to the two most significant bits of the column address, and two of the fuse circuits, wherein the second decoder circuit generates four of the second redundancy enable signals in response to a combination of the main switching fuse output and the outputs of the two fuse circuits.

6. A column redundancy apparatus for a semiconductor memory device having a plurality of memory cell arrays each comprising a plurality of bitlines, a plurality of memory cells connected to each bitline, a plurality of sense amplifiers coupled between a plurality of data input/output lines and the bitlines, and a plurality of switches controlled by column select signals and coupled between the sense amplifiers and the data input/output lines; and a column redundancy circuit associated with each memory cell array, each column redundancy circuit comprising:

a redundant memory cell array containing at least one redundant memory cell column coupled to redundancy data input/output lines, each redundant memory cell column selected by a redundant column select signal;

a decoded redundancy repair circuit comprising an enable input; a plurality of inputs for receiving a particular column address; an output coupled to a logic circuit and to one of the redundant memory cell columns, for generating the redundant column select signal; a plurality of outputs for generating redundancy enable signals, which are each coupled to one of a plurality of multiplexers; and a main switching fuse circuit coupled to the enable input and having an output responsive to a main fuse, wherein the output of the main switching fuse circuit generates a main switching fuse signal to enable the decoded redundancy repair circuit when the main fuse is in a programmed condition;

a column decoder and input/output control circuit connected between the data input/output lines and a data bus, and receiving a column address and a column disable signal, wherein the column decoder and input/output control circuit generates a column select signal responsive to the column address and selectively connects the data input/output lines to a data bus if the column disable signal is false, and does not generate the column select signal and does not selectively connect the data input/output lines to the data bus if the column disable signal is true;

the logic circuit coupled between the decoded redundancy repair circuit and the column decoder and input/output control circuit, wherein the logic circuit generates the column disable signal in response to a combination of the redundant column select signal, the redundancy enable signals, and a plurality of redundant column select signals and redundancy enable signals generated by other decoded redundancy repair circuits associated with other of the memory cell arrays; and the plurality of multiplexers coupled between the redundancy data input/output lines and the data bus, wherein the multiplexers connect the redundancy data input/output lines to the data bus in response to the redundancy enable signals.

7. A column redundancy apparatus as in claim 6, wherein the decoded redundancy repair circuit in each column redundancy circuit further comprises:

a plurality of first redundancy unit circuits which each have an output coupled to an input of a first decoder which generates the redundant column select signal;

a plurality of second redundancy unit circuits which each have an output coupled to another input of the first decoder; and a plurality of fuse circuits having outputs connected to the second redundancy unit circuits and to a second decoder circuit, wherein the fuse circuit outputs control the second redundancy unit circuits, and wherein the second decoder circuit generates the redundancy enable signals in response to the fuse circuit outputs.

8. A column redundancy apparatus as in claim 7, wherein each of the first redundancy unit circuits further comprises:

a first and a second transmitting circuit each having enable inputs which receive the main switching fuse signal, wherein the first transmitting circuit receives one bit of the column address, and the second transmitting circuit receives the complement of the bit; and a first fuse coupled between an output of the first transmitting circuit and an output node, and a second fuse coupled between an output of the second transmitting circuit and the output node, wherein only one of the first and second fuses is conductive; and a transistor having a source and a drain coupled between the output node and a reference voltage, and a gate coupled to the main switching fuse signal, wherein the transistor is turned off and the output node produces either the bit or the complement of the column address in response to the main switching fuse signal.

9. A column redundancy apparatus as in claim 8, wherein each of the second redundancy unit circuits further comprises:

a first and a second column address transmitting circuit, the first column address transmitting circuit inputting one of a plurality of most significant bits of the column address, and the second column address transmitting circuit inputting the complement of the most significant bit; and wherein the fuse circuit outputs selectively enable either the first or the second column address transmitting circuits.

10. A column redundancy apparatus as in claim 9 having four of the memory cell arrays and four of the column redundancy circuits, wherein each column redundancy circuit further comprises two of the second redundancy unit circuits corresponding to the two most significant bits of the column address, and two of the fuse circuits, and wherein the second decoder circuit generates four of the second redundancy enable signals in response to a combination of the main switching fuse output and the outputs of the two fuse circuits.

* * * * *